United States Patent
Yamada et al.

(10) Patent No.: US 6,255,663 B1
(45) Date of Patent: Jul. 3, 2001

(54) CHARGED PARTICLE BEAM EXPOSURE APPARATUS AND SEMICONDUCTOR DEVICE MANUFACTURING METHOD

(75) Inventors: Atsushi Yamada, Yokohama; Koichi Kamijo, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/689,683

(22) Filed: Oct. 13, 2000

Related U.S. Application Data

(63) Continuation of application No. PCT/JP00/00822, filed on Feb. 15, 2000.

(30) Foreign Application Priority Data

Feb. 15, 1999 (JP) .................................................. 11-035526
Apr. 8, 1999 (JP) .................................................. 11-100894

(51) Int. Cl.$^7$ ................................. G21K 5/00; H01J 5/00
(52) U.S. Cl. .......................... 250/492.23; 355/53; 430/30
(58) Field of Search ......................... 250/492.23; 355/53; 430/30

(56) References Cited

U.S. PATENT DOCUMENTS

| | | |
|---|---|---|
| 5,994,709 | 11/1999 | Suzuki . |
| 6,008,498 | 12/1999 | Simizu . |
| 6,014,200 * | 1/2000 | Sogard et al. ........................ 355/53 |
| 6,027,841 * | 2/2000 | Suzuki ................................. 430/30 |
| 6,064,071 * | 5/2000 | Nakasuji ........................ 250/492.23 |
| 6,087,669 * | 7/2000 | Suzuki ............................ 250/492.23 |
| 6,110,627 * | 8/2000 | Nakasuji ............................. 430/30 |

FOREIGN PATENT DOCUMENTS 10-303118    11/1998    (JP) .

* cited by examiner

Primary Examiner—Jack Berman
Assistant Examiner—Johnnie L Smith, II
(74) Attorney, Agent, or Firm—Oliff & Berridge, PLC

(57) ABSTRACT

A mask is irradiated by an optical illumination system. An electron beam passing through the pattern on the mask is formed into an image on a wafer by two lenses, and a pattern on a mask is projected onto the wafer in reduced manner. The semi-angles and ratio of ampere-turn values of the deflecting coils of at least one of deflectors constituting the deflector are then set in such a manner that a $3\theta$ component, $5\theta$ component and $7\theta$ component of a magnetic field generated by the deflector are substantially zero. As a result, four-fold aberrations generated at the deflector can be reduced.

9 Claims, 15 Drawing Sheets

FIG. 10

```
S11
┌─────────────────────────┐
│  RESIST APPLICATION STEP │
└─────────────────────────┘
            │
            ▼
S12
┌─────────────────────────┐
│      EXPOSURE STEP       │
└─────────────────────────┘
            │
            ▼
S13
┌─────────────────────────┐
│     DEVELOPMENT STEP     │
└─────────────────────────┘
            │
            ▼
S14
┌─────────────────────────┐
│      ANNEALING STEP      │
└─────────────────────────┘
```

LITHOGRAPHIC STEP

FIG. 11

| No. | CORRESPONDING EMBODIMENT | NUMBER OF SHEETS/QUADRANT | SEMI-ANGLE | | | | |
|---|---|---|---|---|---|---|---|
| | | | COIL 1 | COIL 2 | COIL 3 | COIL 4 | COIL 5 |
| 1 | 1 | 2 | 36.000 | 72.000 | | | |
| 2 | 1 | 3 | 25.714 | 51.429 | 77.143 | | |
| 3 | 1 | 4 | 20.000 | 40.000 | 60.000 | 80.000 | |
| 4 | 2 | 2.5 | 18.000 | 54.000 | 90.000 | | |
| 5 | 2 | 3.5 | 12.857 | 38.571 | 64.286 | 90.000 | |
| 6 | 2 | 4.5 | 10.000 | 30.000 | 50.000 | 70.000 | 90.000 |
| 7 | 4 | 2.5 | 30.000 | 60.000 | 90.000 | | |
| 8 | 4 | 3.5 | 22.500 | 45.000 | 67.500 | 90.000 | |
| 9 | 5 | 3 | 15.000 | 45.000 | 75.000 | | |
| 10 | 5 | 4 | 11.250 | 33.750 | 56.250 | 78.750 | |
| 11 | 6 | 3 | 33.944 | 63.063 | 78.330 | | |
| 12 | 6 | 3.5 | 31.650 | 57.484 | 72.959 | 90.000 | |

FIG. 12

| No. | EXCITATION CURRENT (Ampere-Turns) | | | | |
|---|---|---|---|---|---|
| | COIL 1 | COIL 2 | COIL 3 | COIL 4 | COIL 5 |
| 1 | 0.407 | 0.659 | | | |
| 2 | 0.215 | 0.387 | 0.482 | | |
| 3 | 0.132 | 0.247 | 0.333 | 0.379 | |
| 4 | 0.214 | 0.561 | 0.346 | | |
| 5 | 0.110 | 0.309 | 0.446 | 0.247 | |
| 6 | 0.067 | 0.192 | 0.295 | 0.362 | 0.192 |
| 7 | 0.289 | 0.500 | 0.289 | | |
| 8 | 0.166 | 0.306 | 0.400 | 0.217 | |
| 9 | 0.149 | 0.408 | 0.558 | | |
| 10 | 0.084 | 0.241 | 0.360 | 0.425 | |
| 11 | 0.357 | 0.357 | 0.357 | | |
| 12 | 0.307 | 0.307 | 0.307 | 0.153 | |

FIG. 13

| No. | $d_1$ | $d_3$ | $d_5$ | $d_7$ | $d_9$ | $d_{11}$ | $d_{13}$ | $d_{15}$ | $d_{17}$ |
|---|---|---|---|---|---|---|---|---|---|
| 1 | 0.866 | 0.000 | 0.000 | 0.000 | -0.866 | | | | |
| 2 | 0.866 | 0.000 | 0.000 | 0.000 | 0.000 | 0.000 | -0.866 | | |
| 3 | 0.866 | 0.000 | 0.000 | 0.000 | 0.000 | 0.000 | 0.000 | 0.000 | -0.866 |
| 4 | 0.866 | 0.000 | 0.000 | 0.000 | 8.666 | 0.000 | | | |
| 5 | 0.87 | 0.00 | 0.00 | 0.00 | 0.00 | 0.00 | 0.87 | | |
| 6 | 0.87 | 0.00 | 0.00 | 0.00 | 0.00 | 0.00 | 0.00 | 0.00 | 0.87 |
| 7 | 0.866 | 0.000 | 0.000 | 0.000 | 0.000 | -0.866 | 0.00 | | |
| 8 | 0.87 | 0.00 | 0.00 | 0.00 | 0.00 | 0.00 | 0.00 | -0.87 | |
| 9 | 0.866 | 0.000 | 0.000 | 0.000 | 0.000 | 0.866 | 0.000 | | |
| 10 | 0.866 | 0.000 | 0.000 | 0.000 | 0.000 | 0.000 | 0.000 | 0.866 | |
| 11 | 0.866 | 0.000 | 0.000 | 0.000 | -0.548 | | | | |
| 12 | 0.87 | 0.00 | 0.00 | 0.00 | -0.30 | | | | |

$$d_{2k-1} = \Sigma J_i \cdot \sin(2k-1)\theta_i$$

FIG. 14

| No. | SEMI-ANGLE PERMISSIBLE ERROR (±deg) | | | | | AMPERE-TURN PERMISSIBLE ERROR (±) | | | | |
|---|---|---|---|---|---|---|---|---|---|---|
| | COIL 1 | COIL 2 | COIL 3 | COIL 4 | COIL 5 | COIL 1 | COIL 2 | COIL 3 | COIL 4 | COIL 5 |
| 1 | 0.548 | 0.339 | | | | 0.009 | 0.014 | | | |
| 2 | 0.848 | 0.471 | 0.378 | | | 0.008 | 0.019 | 0.011 | | |
| 3 | 1.199 | 0.638 | 0.473 | 0.416 | | 0.010 | 0.010 | — | 0.010 | |
| 4 | 0.932 | 0.356 | 0.288 | | | 0.010 | 0.027 | 0.004 | | |
| 5 | 1.532 | 0.547 | 0.378 | 0.341 | | 0.013 | 0.009 | 0.037 | 0.004 | |
| 6 | 2.226 | 0.773 | 0.505 | 0.411 | 0.386 | 0.017 | 0.008 | 0.017 | 0.017 | 0.004 |
| 7 | 0.691 | 0.399 | 0.346 | | | 0.008 | — | 0.004 | | |
| 8 | 1.018 | 0.551 | 0.422 | 0.390 | | 0.009 | 0.012 | 0.022 | 0.004 | |
| 9 | 1.219 | 0.446 | 0.327 | | | 0.012 | 0.012 | 0.012 | | |
| 10 | 1.868 | 0.656 | 0.438 | 0.372 | | 0.015 | 0.008 | 0.042 | 0.010 | |
| 11 | 0.511 | 0.511 | 0.511 | | | 0.008 | 0.052 | 0.010 | | |
| 12 | 0.550 | 0.550 | 0.550 | 0.550 | | 0.008 | 0.063 | 0.013 | 0.004 | |

FIG. 15

|  | | EX. 1 | EX. 2 | EX. 3 | EX. 4 | EX. 5 |
|---|---|---|---|---|---|---|
| COIL DIMENSIONS OF C1 TO C8 | LENGTH IN DIRECTION OF OPTICAL AXIS (mm) | 45 | 45 | 45 | 45 | 45 |
|  | INTERNAL RADIUS (mm) | 35 | 35 | 35 | 35 | 35 |
|  | EXTERNAL RADIUS (mm) | 74 | 74 | 74 | 74 | 74 |
| COIL DIMENSIONS OF P1 TO P4 | LENGTH IN DIRECTION OF OPTICAL AXIS (mm) | 27 | 27 | 27 | 27 | 27 |
|  | INTERNAL RADIUS (mm) | 19 | 19 | 19 | 19 | 19 |
|  | EXTERNAL RADIUS (mm) | 47 | 47 | 47 | 47 | 47 |
| SEMI-ANGLE | COIL 1 (deg.) | 36.000 | 33.944 | 25.714 | 20.000 | 6.000 |
|  | COIL 2 (deg.) | 72.000 | 63.063 | 51.429 | 40.000 | 66.000 |
|  | COIL 3 (deg.) |  | 78.330 | 77.143 | 60.000 |  |
|  | COIL 4 (deg.) |  |  |  | 80.000 |  |
| Ampere-Turn VALUE | COIL 1 (deg.) | 0.407 | 0.357 | 0.215 | 0.132 | 0.851 |
|  | COIL 2 (deg.) | 0.656 | 0.357 | 0.387 | 0.247 | 0.851 |
|  | COIL 3 (deg.) |  | 0.357 | 0.482 | 0.333 |  |
|  | COIL 4 (deg.) |  |  |  | 0.379 |  |
| FOUR-FOLD ABERRATIONS CAUSED BY THIRD-ORDER COMPONENT | BLUR | 0.0 | 0.0 | 0.0 | 0.0 | 0.0 |
|  | DISTORTION | 0.0 | 0.0 | 0.0 | 0.0 | 0.0 |
| FOUR-FOLD ABERRATIONS CAUSED BY FIFTH-ORDER COMPONENT | BLUR | 0.0 | 0.0 | 0.0 | 0.0 | 0.0 |
|  | DISTORTION | 0.0 | 0.0 | 0.0 | 0.0 | 0.0 |
| FOUR-FOLD ABERRATIONS CAUSED BY SEVENTH-ORDER COMPONENT | BLUR | 0.0 | 0.0 | 0.0 | 0.0 | 267.2 |
|  | DISTORTION | 0.0 | 9.5 | 0.0 | 0.0 | 314.1 |
| FOUR-FOLD ABERRATIONS CAUSED BY NINTH-ORDER COMPONENT | BLUR | 15.1 | 9.5 | 0.0 | 0.0 |  |
|  | DISTORTION | 15.9 | 10.0 | 0.0 | 0.0 |  |

CHARGED PARTICLE BEAM EXPOSURE APPARATUS AND SEMICONDUCTOR DEVICE MANUFACTURING METHOD

This application is a continuation of PCT International application No. PCT/JP00/00822 filed Feb. 15, 2000.

INCORPORATION BY REFERENCE

This application is based on Japanese Patent Application No. 11-35526, filed Feb. 15, 1999 and Japanese Patent Application No.11-100894, filed Apr. 8, 1999 and its contents are incorporated herein by reference.

BACKGROUND OF THE INVENTION

1. Field of the Invention

The present invention relates to a charged particle beam exposure apparatus for exposing a sensitive substrate such as a wafer etc. with an image of a pattern formed on a mask or reticle using a charged particle beam.

2. Related Art

Conventional exposure methods for charged particle beam exposure apparatus can be classified into the following three types.
(1) Spot beam exposure methods
(2) Variable-shaped beam exposure methods
(3) Block exposure methods These methods of exposure provide excellent resolution when compared to conventional batch transfer methods employing light, but this was provided at the expense of throughput. In particular, with the exposure methods of (1) and (2), throughput is limited because exposure is carried out so as to trace a pattern with a spot of an extremely small spot diameter or with a rectangular beam. Further, the block exposure method of (3) has been developed in order to improve the throughput. Here, a standardized pattern is made into a mask and throughput is improved by batch-projecting this pattern. However, since in this method the number of patterns that can be made into masks is limited, it is necessary to use the variable-shaped beam exposure method together with the block exposure method of (3). Throughput is therefore not improved to the anticipated extent.

In order to improve the poor throughput of conventional charged particle beam exposure apparatus, divided projection exposure apparatus in which a substrate is projected and exposed with an image of a pattern formed in a portion of reticle are being developed.

With this divided projection exposure apparatus, a plurality of chips are formed on a sensitive substrate (usually a wafer). Regions of each chip are partitioned into a plurality of stripes, and each stripe is divided into a plurality of sub-fields. On the other hand, patterns to be transferred to the chips of the sensitive substrate are formed at the reticles and these patterns are similarly divided into stripes and sub-fields corresponding to the stripes and sub-fields of the chips.

An exposure method employing an electron beam will be explained. A reticle stage mounted with a reticle and a wafer stage mounted with a wafer are moved at a fixed speed in accordance with the rate of reduction for pattern projection. At this time, an optical axis of the exposure apparatus passes through each center of stripes of the reticle and the chip. A sub-field on the reticle is irradiated with the electron beam and a pattern formed on the reticle is projected onto the sensitive substrate by an optical projection system so that the sensitive substrate is exposed with an image of the pattern.

The electron beam is then deflected in a direction substantially at right angles to the direction of progression of the reticle stage, and the pattern of the mask sub-fields arranged in a line are sequentially projected upon the sensitive substrate so that the sensitive substrate is exposed with the pattern image. When projection exposure of the line of mask sub-fields is complete, projection exposure of the next line of mask sub-fields begins. The direction of deflection of the electron beam is reversed for each line and the patterns of mask sub-fields are sequentially projected in order that throughput is increases.

By carrying out exposure using this method, compared to conventional charged particle beam exposure apparatus, each of mask sub-field regions is collectively irradiated with the electron beam so that the sensitive substrate is exposed with an image of the pattern in each mask sub-field. And all patterns with which a sensitive substrate is exposed are formed on the reticle so that throughput can be increased substantially as a result.

Optical projection systems for exposure apparatus employing electron beams consist of lenses and deflectors, etc. However, magnetic fields other than the deflecting field by the deflectors are also generated at the same time due to the setting of the semi-angles of the deflecting coils and the setting of the current flowing in each deflecting coil. If magnetic field distribution is expressed with a cylindrical coordinate system $(z, r, \theta)$ taking the angle of rotation about the optical axis as $\theta$, the deflection field can be expressed in a form combining components proportional to the lowest order trigonometric functions $\cos[\theta]$, $\sin[\theta]$. However, the magnetic field for other than the deflection field is expressed by combining components proportional to odd-numbered order trigonometric functions of $\cos[3\theta]$, $\sin[3\theta]$ and $\cos[5\theta]$, and $\sin[5\theta]$, etc.

These high-order components do not contribute to electron beam deflection but do cause a group of aberrations referred to as a so-called "four-fold aberrations". These four-fold aberrations cause the image of the electron beam to blur and cause the shape of the projected image to become distorted. This causes undesirable disconnection in an integrated circuit formed on the wafer surface or changes in shape. These four-fold aberrations also occur for deflectors designed so that the $3\theta$ component and $5\theta$ component of the magnetic field become substantially zero. Conventionally, it has been considered that errors in assembly of the deflectors causes magnetic fields of the $3\theta$ component and the $5\theta$ component. Therefore, attempts have been made to improve the precision with which the coils are made and the deflectors are assembled. However, such efforts have not brought sufficient results.

This kind of problem does not just occur for exposure apparatus employing electron beams, but also occurs when other charged particle beams are employed.

SUMMARY OF THE INVENTION

It is therefore the object of the present invention to provide a charged particle beam exposure apparatus where the four-fold aberrations generated by the deflectors are reduced.

It is a further object of the present invention to provide a highly integrated semiconductor device with a very small line width and a semiconductor device manufacturing method capable of manufacturing this kind of semiconductor device.

In order to achieve the aforementioned objects, with a charged particle beam exposure apparatus according to the present invention, semi-angles and ratio of ampere-turn values of deflecting coils of at least one of the deflectors are set in such a manner that a 3θ component, 5θ component and 7θ component of a magnetic field generated by the deflectors become substantially zero. The four-fold aberrations caused by the 3θ component, 5θ component and 7θ component of the magnetic field can therefore be made substantially zero.

The deflector comprises n(n≧2) sets of deflecting coils with a semi-angle θi of substantially 180°×i/(2n+1) (i=1~n). The ratio of ampere-turn value Ji of each deflecting coil i is then set in such a manner that the following equations (1) and (2) are substantially fulfilled with respect to each integer k from 1 to m. Here, the value of m is set to an arbitrary integer between a minimum value 3 (except that 1 when n=2 and 2 when n=3) and a maximum value (n−1).

The deflector may comprise n(n≧3) sets of deflecting coils with a semi-angle θi of substantially 180°×(i−½)/(2n−1) (i=1~n). The ratio of ampere-turn value Ji of each deflecting coil i is then set in such a manner that the following equations (1) and (2) are substantially fulfilled with respect to each integer k from 1 to m. Here, the value of m is set to an arbitrary integer between a minimum value 3 (except that 2 when n=3) and a maximum value (n−1).

$$\sum_{i=1}^{n} J_i \cdot \sin(\theta_i) \neq 0 \tag{1}$$

$$\sum_{i=1}^{n} J_i \cdot \sin(2k+1)\theta_i = 0 \quad (k = 1, 2, \cdots, m) \tag{2}$$

Following constitution may be acceptable for the present invention. The semi-angle and ampere-turn values of the deflecting coils are set in such a manner that the 3θ component, 5θ component and 7θ components of the magnetic field are not generated. In addition to this, the deflecting coils includes a deflecting coil of a semi-angle of 45° or includes two different deflecting coils with a semi-angle sum of 90°. As a result, at least one of the coils of the X-axis direction deflector and the Y-axis direction deflector located at the same position in the optical axis direction are set so as to overlap. In this case, the number of coils can then be reduced by making the coils at the overlapping position a single coil. And a number of current generating devices can be reduced and costs can therefore be reduced by having the sum of the current required for the X-axis direction deflector and the current required for the Y-axis direction deflector flow in this coil.

In addition to the above, the deflector comprises n(n≧3) sets of deflecting coils with a semi-angle θi of substantially 180°×i/(2n) (i=1~n). The ratio of ampere-turn value Ji of each deflecting coil i can then be set in such a manner that the following equations (1) and (2) are substantially fulfilled with respect to each integer k from 1 to m. Here, the value of m is set to an arbitrary integer between a minimum value 3 (except that 2 when n=3) and a maximum value (n−1).

Further, the deflector comprises n(n≧3) sets of deflecting coils with a semi-angle θi of substantially 180°×(i−½)/(2n) (i=1~n). The ratio of ampere-turn value Ji of each deflecting coil i is then set in such a manner that the following equations (1) and (2) are substantially fulfilled with respect to each integer k from 1 to m. Here, the value of m is set to an arbitrary integer between a minimum value 3(except that 2 when n=3) and a maximum value (n−1).

$$\sum_{i=1}^{n} J_i \cdot \sin(\theta_i) \neq 0 \tag{1}$$

$$\sum_{i=1}^{n} J_i \cdot \sin(2k+1)\theta_i = 0 \quad (k = 1, 2, \cdots, m) \tag{2}$$

The deflectors may also comprise n(n≧3) sets of deflecting coils, with the semi-angle and ampere-turn values of these deflecting coils being set in such a manner that the 3θ component, 5θ component and 7θ component of the magnetic field substantially do not occur. In this case, a coil supply device can be shared and costs reduced because the ampere-turn values of each of the coils are set to be equal.

A highly integrated semiconductor device with an extremely small line width can therefore be made by employing the aforementioned charged particle beam exposure apparatus in a lithographic step in a semiconductor device manufacturing method having a lithographic step.

BRIEF DESCRIPTION OF THE DRAWINGS

FIG. 10 is a flowchart showing a lithographic process in a wafer-processing step.

FIG. 11 is a view showing semi-angles of deflecting coils constituting deflectors corresponding to the first to sixth embodiments.

FIG. 12 is a table showing ampere-turn values for deflecting coils constituting deflectors corresponding to the first to sixth embodiments.

FIG. 13 is a table showing d 2k−1 values for the deflectors according to the first to sixth embodiments.

FIG. 14 is a view showing permissible error in the semi-angle and ampere-turn values of the deflecting coils of deflectors corresponding to the first to sixth embodiments.

FIG. 15 is a view showing evaluation results for when the present invention is applied to the optical projection system of the charged particle beam exposure apparatus shown in FIG. 1.

DESCRIPTION OF THE PREFERRED EMBODIMENTS

Figure 1:
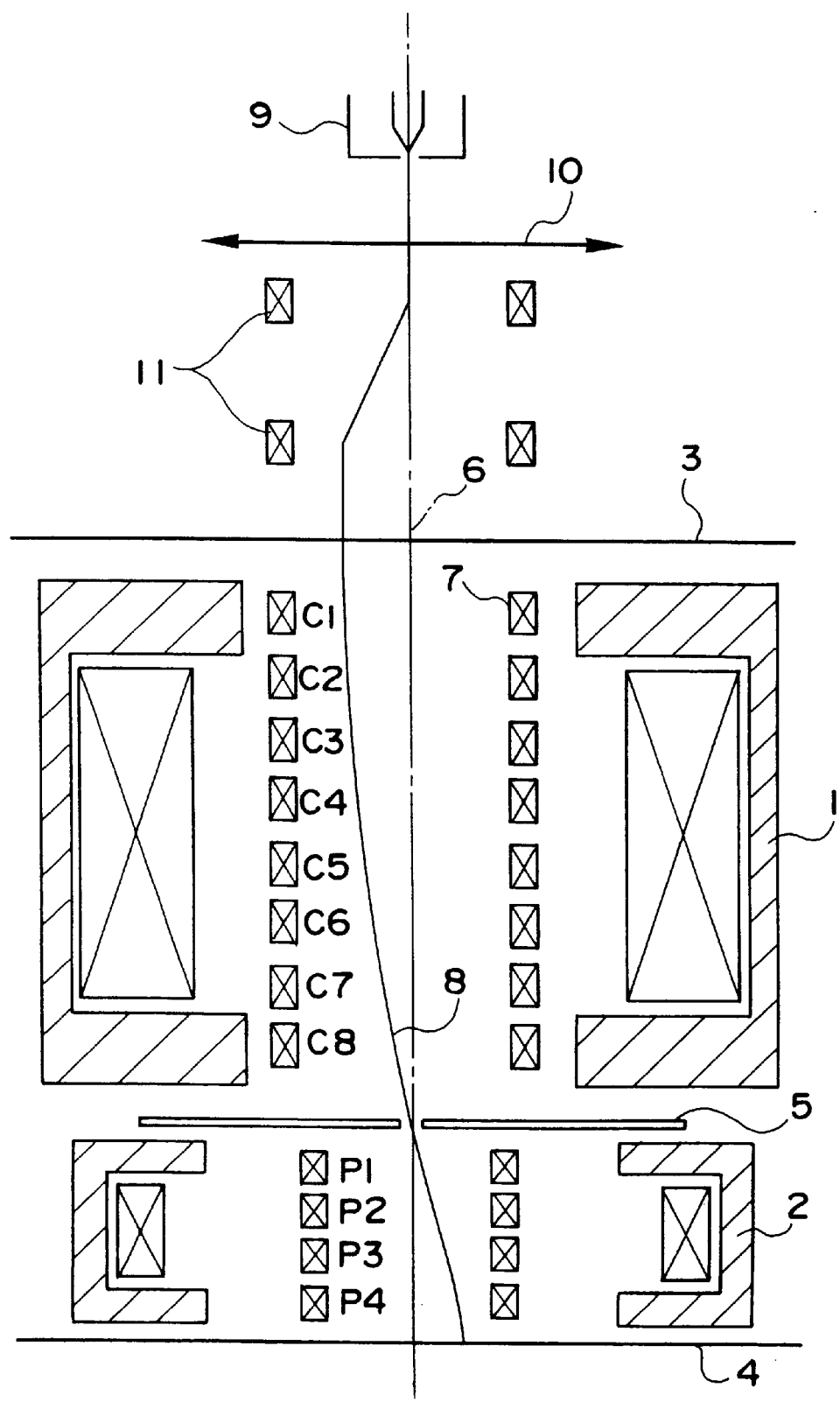
FIG. 1 is a schematic view showing an embodiment of a charged particle beam exposure apparatus according to the present invention.
Figure 2:
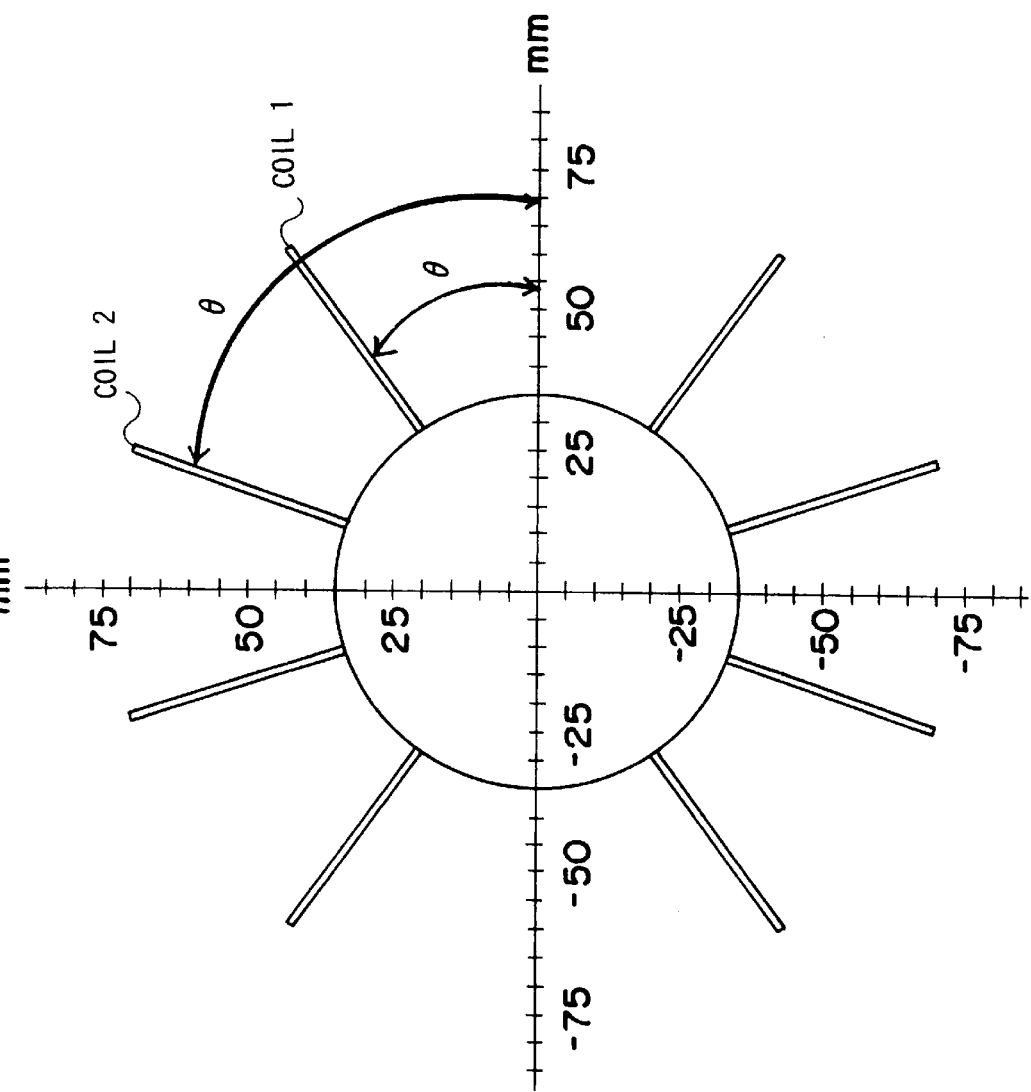
FIG. 2 is a view showing a toroidal-type deflecting coil arrangement employed in an example 1.

An embodiment of the present invention is described in the following with reference to the drawings. FIG. 1 is a view schematically showing the configuration of a charged particle beam exposure apparatus. In FIG. 1, 1 and 2 are lenses, 3 is a mask, 4 is a wafer as a sensitive substrate, 5 is a scattering aperture, 6 is an optical axis, 7 (C1 to C8 and P1 to P4) are deflectors and 8 is the trajectory of the electron beam. The electron beam radiated out from an electron beam source 9 of an electron gun etc. irradiates one mask sub-field of the mask 3 through the influence of a condenser lens 10 and the deflectors 11 constituting an optical illumination system. The electron beam that passes through the pattern for the mask sub-field forms an image on the wafer 4 due to the two lenses 1 and 2 and the image of the pattern on the mask 3 is reduced and projected onto the wafer 4.

The scattering aperture 5 for cutting scattered radiation is provided between the lens 1 and the lens 2. A total of twelve deflectors 7 are provided, with eight deflectors C1 to C8 being provided on the mask side from the scattering aperture 5 and four deflectors P1 to P4 being provided on the wafer side from the scattering aperture 5. The deflectors 7 not only deflect the electron beam so that the electron beam outputted at a prescribed position of the mask 3 passes on a prescribed trajectory 8 of the electron beam so as to pass through the scattering aperture 5 and form a pattern image at a prescribed position of the wafer 4, but also reduce image distortion and aberrations.

However, even with deflectors designed so that the 3θ component and the 5θ component of the magnetic field become substantially zero, four-fold aberrations still remain. The inventor has found through numerical calculation that they are caused because four-fold aberrations of a magnitude that cannot be ignored are generated by the 7θ component of the magnetic field.

In the present invention, the four-fold aberrations can also be made substantially zero by setting the layout (semi-angles) and ampere-turn values of the deflecting coil of at least one of the deflectors C1 to C8 and P1 to P4 constituting the deflector 7 and the deflector 11 in such a manner that not only the 3θ component and the 5θ component of the magnetic field, but also the 7θ component of the magnetic field substantially does not occur. Here, "substantially does not occur" can also mean not a state where the four-fold aberrations are completely not generated, providing that the four-fold aberrations are within a range permitted for the design for the charged particle beam exposure device. In the following description, a description is given for the case of setting the deflectors C1 to C8 and P1 to P4 whose layout and ampere-turn values are set as described above and which are provided at the optical projection system. Exactly the same also can apply for the deflectors 11 of the optical illumination system.

In the following, a description is given of an embodiment where a semi-angle of a deflecting coil i is θi, the ampere-turn value of a deflecting coil I is Ji, and four-fold aberrations are substantially 0.

First Embodiment

In the first embodiment, the deflector comprises n(n≧2) sets of deflecting coils having semi-angles θi=180°×i/(2n+1) (i=1~n). Ratio of ampere-turn values Ji for each deflecting coil i are set so that the following equations (1) and (2) are fulfilled with respect to each integer k from 1 to m. However, the value for m is set to be an arbitrary integer between a minimum value of 3 (except that 1 when n=2 and 2 when n=3) and a maximum value (n−1).

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k=1, 2, \cdots, m) \quad (2)$$

The left side of equation (1) expresses the magnetic field contributing to deflection. Equation (1) itself shows that the magnetic field contributing to deflection is not zero. On the other hand, the left side of equation (2) expresses the (2k+1) θ components of the magnetic field generated by the deflector. Equation (2) shows that the (2k+1) θ components of the magnetic field generated by the deflector is 0.

When a number of sets of deflecting coils is n≧4, the minimum value of m is 3 and equations (2) for k=1 to k=3 are established whatever the value of n. As a result, it can be guaranteed that the (2k+1) θ component of the magnetic field becomes 0 for k=1 to K=3 and the 3θ, 5θ and 7θ component of the magnetic field can therefore be made zero.

When the number of sets of deflecting coils is n=3, equations (2) with respect to k=1, 2 are established and the 3θ and 5θ component of the magnetic field therefore become zero. However, each sin θi automatically becomes zero because the semi-angles θ1, θ2, θ3 (radians) of each deflecting coil are π/7, 2π/7, and 3π/7.

When the number of sets of deflecting coils is n=2, the 3θ component of the magnetic field becomes zero from equation 2 and the semi-angles θ1 and θ2 (radians) become π/5 and 2π/5 and the 5θ component of the magnetic field becomes zero. The 7θ component of the magnetic field then becomes:

Sin(7θ1)=Sin(7π/5)=−Sin(−7π/5)=−Sin(2π−7π/5)=−Sin(3π/5)=−Sin(3θ1)

Similarly,

Sin(7θ2)=Sin(14π/5)=Sin(4π/5)=−Sin(2π−4π/5)=−Sin(6π/5)=−Sin(3θ2)

As a result,

J1 Sin(7θ1)+J2 Sin(7θ2)=−{J1 Sin(3θ1)+J2 Sin(3θ2)}=0 and the 3θ component of the magnetic field is zero, so it can therefore automatically be guaranteed that the 7θ component of the magnetic field will also be zero.

Through use of these properties of trigonometric functions, rather than the number of sets of deflecting coils being limited to the case of n=2, in case that when n≧3, if the value for m is set to the maximum value (n−1) and equations (2) for k=1 to (n−1) are established, components up to (2n−1) of the magnet field can become zero, and therefore it can be understood that components up to (4n−1 ) of the magnet field also become zero.

From the above, in the first embodiment, a number of sets of deflecting coils n of 2 is sufficient to put the 3θ, 5θ and 7θ component of the magnetic field in the high order component to zero, and setting in this manner is also the most economical. However, three sets or more of deflecting coils may also be employed to take into consideration the voltage load of the coil drive apparatus, etc. The above explanation indicates that, if the semi-angle θi and the ratio of ampere-turn value Ji of the deflecting coils constituting the deflector fulfill equation (1) and equation (2), the 3θ component, 5θ component and 7θ component of the magnetic field all become zero. However it is acceptable that if all odd order components are not zero and that the four-fold aberrations are within a range permitted for the design of the charged particle beam exposure apparatus. If the four-fold aberrations are within the permitted range, setting may be such that the semi-angle θi and the ratio of ampere-turn value Ji substantially satisfy equation (1) and equation (2) and the 3θ component, 5θ component and 7θ component of the magnetic field are substantially zero. When the charged particle systems have a plurality of deflectors, it is not necessary to set all of the deflectors in the aforementioned manner since the foregoing holds true in this case.

In case that three sets or more of deflecting coils are employed, firstly the value of the left side of equation (1) is decided by the required amount of deflection of the electron beam. Therefore, if the value of m is set to a maximum value (n−1) and equations (2) with respect to k values from 1 to (n−1) are established, n equations relating to n items of Ji are obtained. Thereafter, the ampere-turn value Ji is univocally decided for each deflecting coil.

Second Embodiment

The deflector according to the second embodiment comprises n(n≧3)sets of deflecting coils having semi-angles θi=180°×(i−½)/(2n−1) (i=1~n). Ratio of ampere-turn values Ji for each deflecting coil i are set so that the following equations (1) and (2) are fulfilled with respect to each integer k from 1 to m. The value of m is set to an arbitrary integer between a minimum value 3 (except that 2 when n=3) and a maximum value (n−1).

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k = 1, 2, \cdots, m) \quad (2)$$

In this second embodiment, when n≧4, equations (2) for k=1 to k=3 are established as in the case of the first embodiment. As a result, it can be guaranteed that the(2k+1) θ component of the magnetic field becomes 0 for k=1 to k=3 and the 3θ, 5θ, and 7θ component of the magnetic field can therefore be made zero.

When the set number n for the deflecting coil is n=3, zero can only be guaranteed from equation (2) for just the 3θ component and the 5θ component of the magnetic field. However, Sin(7θ1)=Sin(7π/10)=Sin(π−7π/10)=Sin(3π/10)=Sin(3θ1)

Sin(7θ2)=Sin(14π/10)=Sin(2π−7π/10)=Sin(6π/10)=Sin(3θ2)

Sin(7θ3)=Sin(21π/10)=Sin(3π−21π/10)=Sin(9π/10)=Sin(3θ3)

and therefore

J1 Sin(7θ1)+J2 Sin(7θ2)+J3 Sin(7θ3)={J1 Sin(3θ1)+J2 Sin(3θ2)+ J3 Sin(3θ3)}=0

Thus, the 7θ component of the magnetic field also becomes zero because the 3θ component of the magnetic field is zero.

Through use of these properties of trigonometric functions, when the value for m is set to the maximum value (n−1) for n≧4 as well as n=3 and equations (2) for k=1 to (n−1) are established, so that components up to (2n−1) can become zero and it can be understood that components up to (4n−5) also become zero.

From the above, a number of sets of deflecting coils n of 3 is sufficient to put the 3θ, 5θ and 7θ component of the magnetic field in the high order component to zero in the second embodiment, and setting in this manner is also the most economical. However, four sets or more of deflecting coils can also be employed to take into consideration the voltage load of the coil drive apparatus, etc.

In case that four sets or more of deflecting coils are employed, firstly the value of the left side of equation (1) is decided by the required amount of deflection of the electron beam. Thereafter, if the value of m is set to a maximum value (n−1) and equations (2) with respect to k values from 1 to (n−1) are established, n equations relating to n items of Ji are obtained. Therefore, the ratio of ampere-turn value Ji can be univocally decided for each deflecting coil.

The semi-angle θn of the nth (i=n) deflecting coil becomes always 90° when the semi-angle θi of the deflecting coil is taken to be θi=180°×(i−½)/(2n−1) as in this second embodiment. Coils of quadrant 1 and quadrant 4 and coils of quadrant 2 and quadrant 3 therefore overlap when the deflecting coils of quadrant 1 and quadrant 2, and deflecting coils of quadrant 3 and quadrant 4 form a set. In this case, the overlapping coils can be configured from one coil, and two times the calculated ampere-turn value is sufficient for this coil to be applied.

Third Embodiment

In the deflector according to the third embodiment, the semi-angles and ratio of ampere-turn values of the deflecting coils are set in such a manner that the 3θ component, 5θ component and 7θ component of the magnetic field substantially do not occur. Further, a deflecting coil of a semi-angle of 45° is included in these deflecting coils or deflecting coils where the sum of the semi-angles for two different deflecting coils is 90° are included.

In this third embodiment, at least one deflecting coil is located in the same position for the X-axis direction deflector and the Y-axis direction deflector. Namely, the Y-axis direction deflector is rotated by 90° about the optical axis with respect to the X-direction deflector so that, for example, the deflecting coil of the X-axis direction deflector and the deflecting coil of the Y-axis direction deflector are in the same position when a deflecting coil of a semi-angle of 45° is included. In this case, the deflecting coils can be shared and the number of deflecting coils and the number of current generating apparatus can be reduced. Current flowing in these deflecting coils is then the sum of the current required by the X-axis direction deflector and the current required by the Y-axis direction deflector.

Fourth Embodiment

In the fourth embodiment, the deflector comprises n(n≧3) sets of deflecting coils having semi-angles θi=180°×i/(2n) (i=1~n). Ratio of ampere-turn values Ji for each deflecting coil i are set so that the following equations (1) and (2) are fulfilled with respect to each integer k from 1 to m. The value of m is set to an arbitrary integer between a minimum value 3 (except that 2 when n=3) and a maximum value (n−1).

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k = 1, 2, \cdots, m) \quad (2)$$

In this fourth embodiment also, the 3θ component, 5θ component and 7θ component of the magnetic field can all be made zero based on equation (2)when n≧4 as in the first and second embodiments described above. Further, when n=3, it can only be guaranteed that the 3θ component and 5θ component of the magnetic field will be zero. However:

Sin(7θ1)=Sin(7π/6)=−Sin(7π/6−2π)=−Sin(5π/6)=−(5θ1)

Sin(7θ2)=Sin(14π/6)=−Sin(14π/6−4π)=−Sin(10π/6)=−Sin(5θ2)

Sin(7θ3)=Sin(21π/6)=−Sin(21π/6−6π)=−Sin(15π/6)=−Sin(5θ3)

and therefore

J1 Sin(7θ1)+J2 Sin(7θ2)+J3 Sin(7θ3)=−{J1 Sin(5θ1)+J2 Sin(5θ2)+J3 Sin(5θ3)}=0

As a result, the 7θ component of the magnetic field also becomes zero because the 3θ component of the magnetic field is zero.

When n≧4, based on the same relationship, if equation (2) is decided in such a manner that up to the (2n−1) θ component of the magnetic field become zero, the (4n−3) θ component of the magnetic field also becomes zero.

As a result, a number of sets of deflecting coils n of 3 is sufficient to put the 3θ, 5θ and 7θ components of the magnetic field in the high order component to zero in the fourth embodiment, and setting in this manner is also the most economical. However, four sets or more of deflecting coils may also be employed to take into consideration the voltage load of the coil drive apparatus, etc. In case that four sets or more are adopted as the n sets of coils, if the value of m is set to a maximum value (n−1) and equations (2) with respect to values of k from 1 to (n−1) are established, the ratio of the ampere-turn values Ji for each deflecting coil can be univocally fixed. And up to the (4n−3) component of the magnetic field can then be made zero by employing the trigonometric function relationship already described above. Then when the value for the left side of equation (1) is decided by the required amount of deflection, the ampere-turn value Ji for each deflecting coil is univocally decided.

When the semi-angle θi of the deflecting coil is taken to be θi=180°×i/(2n) (i=1~n) as in the fourth embodiment, the semi-angle θn of the nth (i=n) deflecting coil becomes always 90°. The overlapping of deflecting coils described in the second embodiment therefore occurs. A method for making the overlapping coils a single coil is the same as described in the second embodiment.

Fifth Embodiment

In the deflector according to the fifth embodiment, the deflector comprises n(n≧3) sets of deflecting coils having semi-angles θi=180° X(i−½)/(2n) (i=1~n). Ratio of ampere-turn values Ji for each deflecting coil i are set so that the following equations (1) and (2) are fulfilled with respect to each integer k from 1 to m. Where the value of m is set to an arbitrary integer between a minimum value 3 (except that 2 when n=3) and a maximum value (n−1).

$$\sum_{i=1}^{n} J_i \cdot \sin(\theta_i) \neq 0 \qquad (1)$$

$$\sum_{i=1}^{n} J_i \cdot \sin(2k+1)\theta_i = 0 \quad (k=1,2,\cdots,m) \qquad (2)$$

In this fifth embodiment also, the 3θ component, 5θ component and 7θ component of the magnetic field can all be made zero based on equation (2)when n≧4. Further, when n=3, it can only be guaranteed that the 3θ component and 5θ component will be zero. However:

Sin(7θ1)=Sin(7π/12)=Sin(π−7π/12)=Sin(5π/12)=Sin(5θ1)

Sin(7θ2)=Sin(14π/12)=Sin(2π−14π/12)=Sin(10π/12)=Sin(5θ2)

Sin(7θ3)=Sin(21π/12)=Sin(3π−21π/12)=Sin(15π/12)=Sin(5θ3)

and therefore

J1 Sin(7θ1)+J2 Sin(7θ2)+J3 Sin(7θ3)=−{J1 Sin(5θ1)+J2 Sin(5θ2)+J3 Sin(5θ3)}=0

As a result, the 7θ component of the magnetic field also become zero because the 5θ component of the magnetic field is zero.

When n≧4, thanks to the same relationship, if equation (2) is decided in such a manner that up to the (2n−1) θ component of the magnetic field become zero, the (4n−3) θ component of the magnetic field also becomes zero.

In the deflector according to the fifth embodiment, a deflecting coil set number n of 3 is sufficient to put the 3θ, 5θ and 7θ components of the high order component of the magnet field to zero, and setting in this manner is also the most economical. However, four sets or more of deflecting coils may also be employed to take into consideration the voltage load of the coil drive apparatus, etc. In case that n sets of coils of four sets or more are employed, if the value of m is set to a maximum value (n−1) and equations (2) with respect to values of k from 1 to (n−1) are established, the ratio of the ampere-turn values Ji for each deflecting coil can be univocally fixed. And up to the (4n−3) component of the magnetic field can then be made zero by employing the trigonometric function relationship already described above. Then, the ampere-turn value Ji for each deflecting coil is univocally decided if the value for the left side of equation (1) is decided by the required amount of deflection.

Sixth Embodiment

In the deflector according to the sixth embodiment, the deflectors comprise n(n≧3) sets of deflecting coils, with the semi-angles and ampere-turn values of these deflecting coils being set in such a manner that the 3θ component, 5θ component and 7θ component of the magnetic field are substantially not generated.

Specifically, the following equation (5) and (6) are satisfied for at least two or less values of k.

$$\sum_{i=1}^{n} \sin(\theta_i) \neq 0 \qquad (5)$$

$$\sum_{i=1}^{n} \sin(2k+1)\theta_i = 0 \quad (k=1,2,\cdots,n-1) \qquad (6)$$

These equations can easily be solved when n≧4. When n=3, in case that equation (6) is not expressed by a linearly independent form and there is symmetry of deflecting coil layouts as described for the first, second, fourth and fifth embodiments, these equations can be resolved.

In the sixth embodiment, the current flowing in each deflecting coil is made to be the same and the number of power supply devices can therefore be made smaller, which is economical.

In the first, second, fourth and fifth embodiments, if the 3θ, 5θ and 7θ component of the magnetic field are intended to be just eliminated, even in the case where five sets or more of deflecting coils are employed, the ampere-turn value Ji for each deflecting coil can be obtained by using the value of m set to a minimum value of 3, equations (2) satisfied with respect to k=1, 2, 3 and the simultaneous equation of the above equation(2) and equation (1). However, in this case since the number of equations is not sufficient to resolve the ampere-turn value Ji of each deflecting coil, the ampere-turn value Ji can then not be univocally obtained and there is therefore redundancy. Accordingly, in the case of n≧5, it is preferable to eliminate a higher order θ component by equation (2) which is made to be satisfied for k from 1 to (n−1).

Examples of combinations of deflecting coils satisfying these stipulations with respect to the first to sixth embodiments are shown in FIG. 11 to FIG. 14. Twelve types of deflector classified by No. are shown in FIG. 11 to FIG. 14, with all the deflectors used being toroidal-type deflectors. FIG. 11 shows the semi-angles of the deflecting coils, FIG. 12 shows the ampere-turn values of the deflecting coils, and FIG. 13 shows the values d 2k−1 expressed by equation (7). For d 2k−1, d1 shows the value of the left side of equation (1) and d3 onwards show the values for the left side of equation (2). d3, d5 and d7 express the 3θ, 5θ and 7θ component of the magnetic field, and d9 onwards express the higher order θ component of the magnetic field.

$$\sum_{i=1}^{n} J_i \cdot \sin(2k-1)\theta_i \quad (k = 1, 2, \cdots, n) \tag{7}$$

In equation (7), n is the number of sets of deflecting coils. In FIG. 11 to FIG. 14, deflector No. 1 to deflector No. 3 are deflectors of the first embodiment, deflector No. 4 to deflector No. 6 are deflectors of the second embodiment, deflector No. 7 and No. 8 are deflectors of the fourth embodiment, deflector No. 9 and No. 10 are deflectors of the fifth embodiment, and deflector No. 11 and deflector No. 12 are deflectors of the sixth embodiment. The number of sets of deflecting coils n for each deflector is 2 for deflector No. 1, 3 for deflector No. 2, No. 4, No. 7, No. 9 and No. 11, 4 for deflector No. 3, No.5, No. 8, No. 10 and No. 12, and 5 for deflector No. 6.

In FIG. 13, checking the magnitude of components of field occurring for higher orders than orders whose components of the magnetic field are not zero is meaningless and is therefore not disclosed here. FIG. 14 gives the permissible error in semi-angle in order to give non-linear distortion due to four-fold aberration errors of less than 10 nm (when there is taken to be no error in the ampere-turn value) and the permitted error in ampere-turn value (when there is taken to be no error in the semi-angle). It is permissible for coil installation angles and ampere-turn values to deviate to a certain extent from ideal values shown in FIG. 11 and FIG. 12 depending on the design precision required of the charged particle exposure apparatus. This extent can be appropriately decided by using FIG. 14 in accordance with the permitted non-linear distortion.

The ampere-turn value in FIG. 12 shows the ampere-turn value required in order to obtain the same deflection sensitivity in the case where excitation is provided to 1 ampere-turn using a one set of deflecting coils of a semi-angle of 60° for a toroidal coil. Namely, each value of Ji is decided in order to satisfy equation (8). Further, an ampere-turn value of two times the value shown in FIG. 12 is provided for a coil of semi-angle of 90° as described above.

$$\sum_{i=1}^{n} J_i \cdot \sin(\theta_i) = \sin 60° \tag{8}$$

In FIG. 11 to FIG. 14, a description is given in each case giving the example of a toroidal coil but the present invention can also be applied to saddle coils and compound saddle coils. In this case, when the overlapping of lines of arced portions of the coils becomes a problem, the coil lines of overlapping portions may be shifted in a radial direction or along the direction of the optical axis, and a design which eliminates the influence of shifting the coils may be adopted.

As is described above, any of the first to sixth embodiments can be applied to all of the 12 deflectors C1 to C8, and P1 to P4 of the charged particle beam exposure apparatus shown in FIG. 1. However, it is by no means necessary to do this and application to at least one deflector is sufficient as described later.

In FIG. 1, a distance between the mask 3 and the wafer 4 is taken to be 600 mm, an excitation current for the lenses 1 and 2 is set so that a 1 mm square pattern at the mask becomes a 0.25 mm square on the wafer 4 and reduction exposure is carried out at a reduction rate of ¼. In the following, the case where a pattern on a mask is irradiated using a beam semi-angle of 6 mrad at a position on a wafer separated by 2.5 mm from the optical axis 6 is considered. Based on the blurring and distortion in the image, deflector performance is evaluated.

FIG. 15 is a view showing evaluation results, and shows four types of example and a comparative example(for a conventional method). FIG. 15 shows the dimensions of the deflectors (all of which are toroidal deflectors), the deflecting coil configuration (set number) and the semi-angles, the ampere-turn values and the higher order aberrations (blurring, distortion) occurring in each case. FIG. 15 Shows the four-fold aberrations caused by the third order component, the fifth order component, the seventh order component, and the ninth order component, separately.

Figure 3:
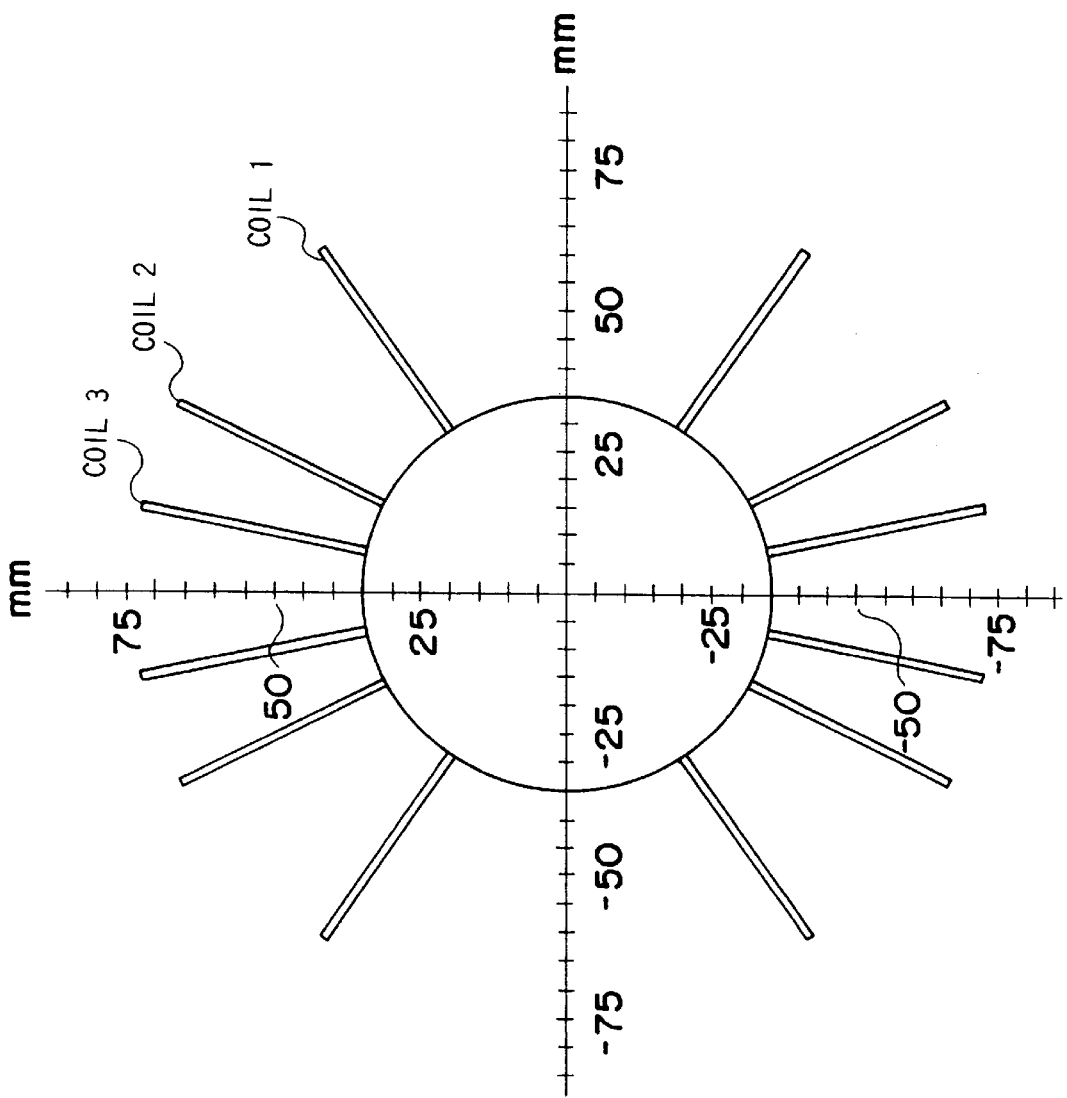
FIG. 3 is a view showing a toroidal-type deflecting coil arrangement employed in an example 2.
Figure 4:
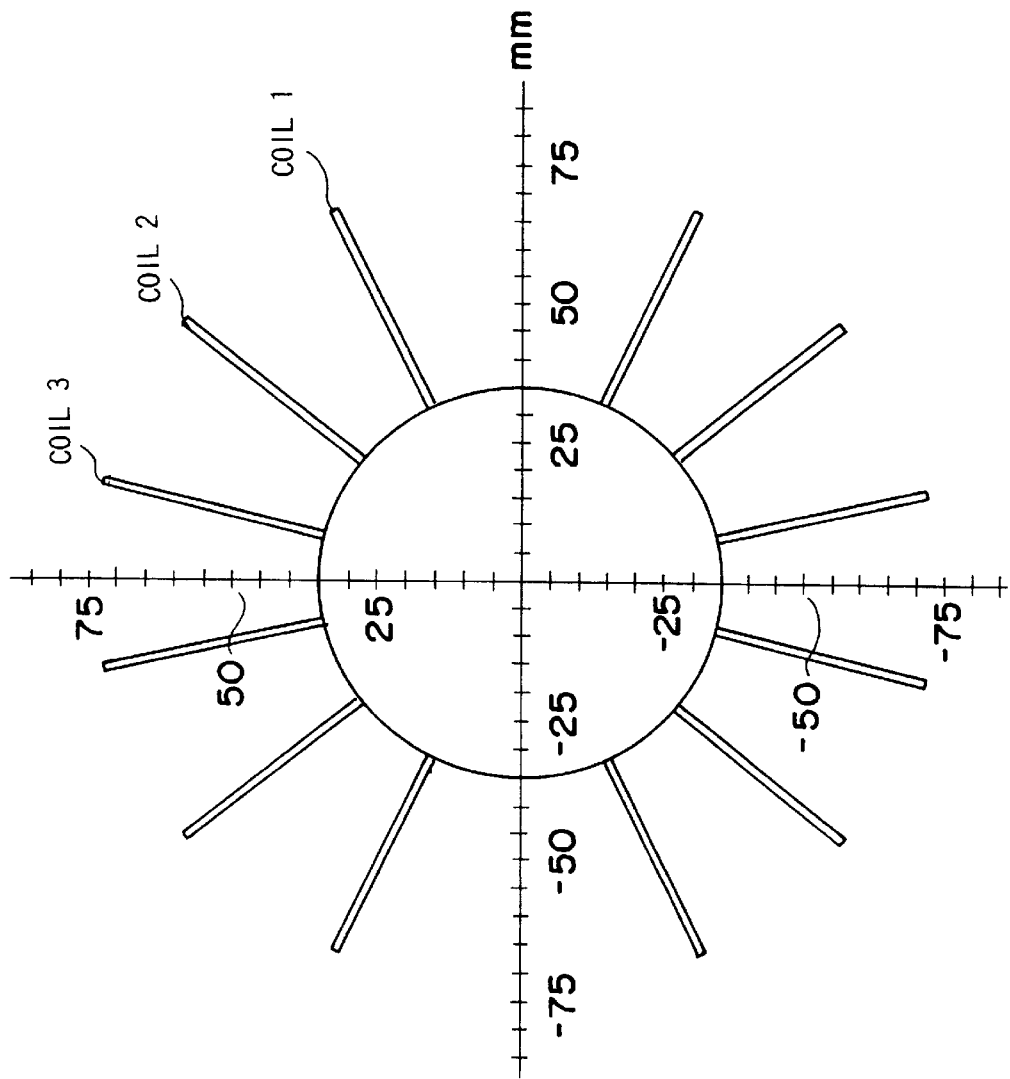
FIG. 4 is a view showing a toroidal-type deflecting coil arrangement employed in an example 3.
Figure 5:
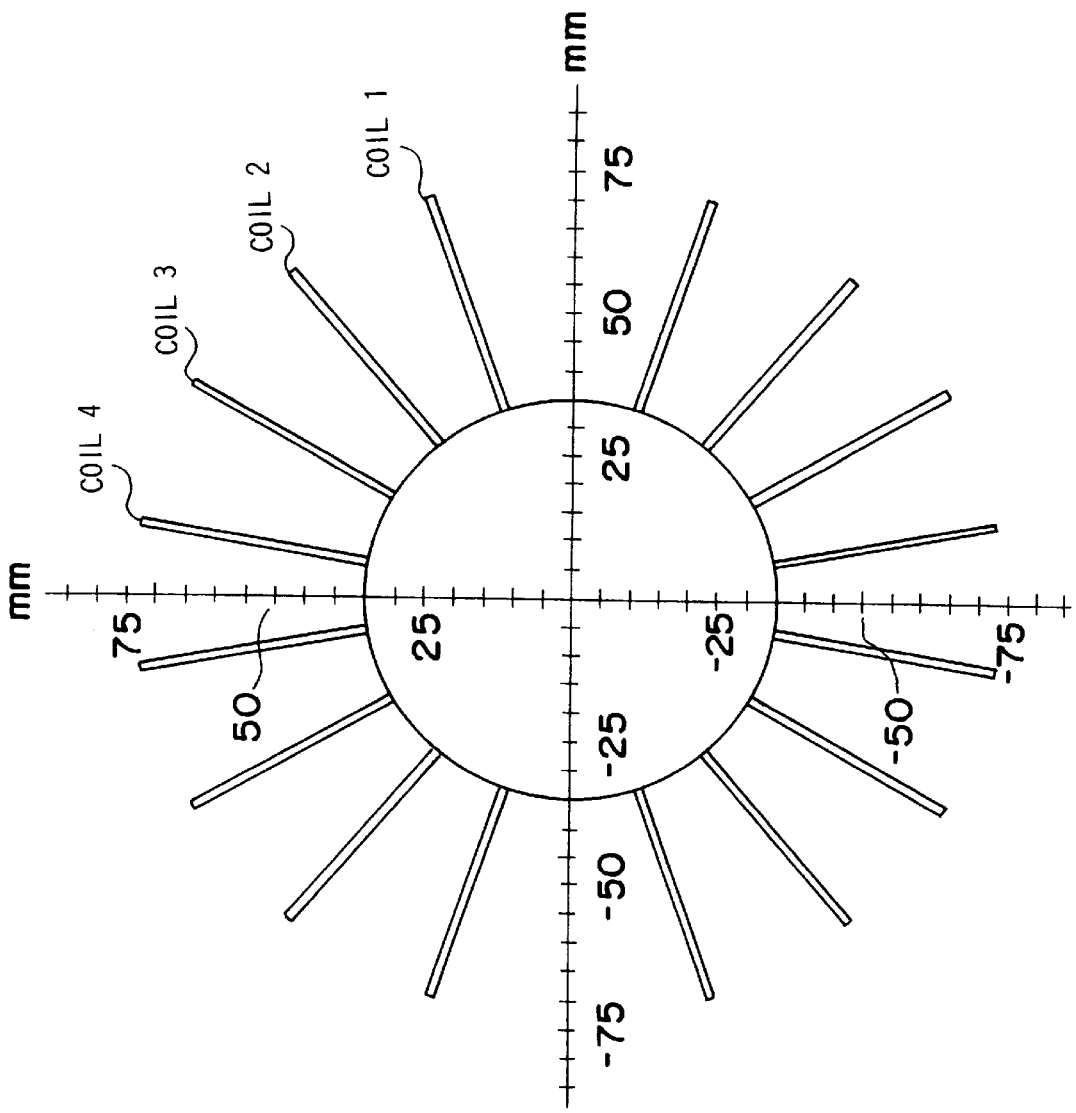
FIG. 5 is a view showing a toroidal-type deflecting coil arrangement employed in an example 4.
Figure 6:
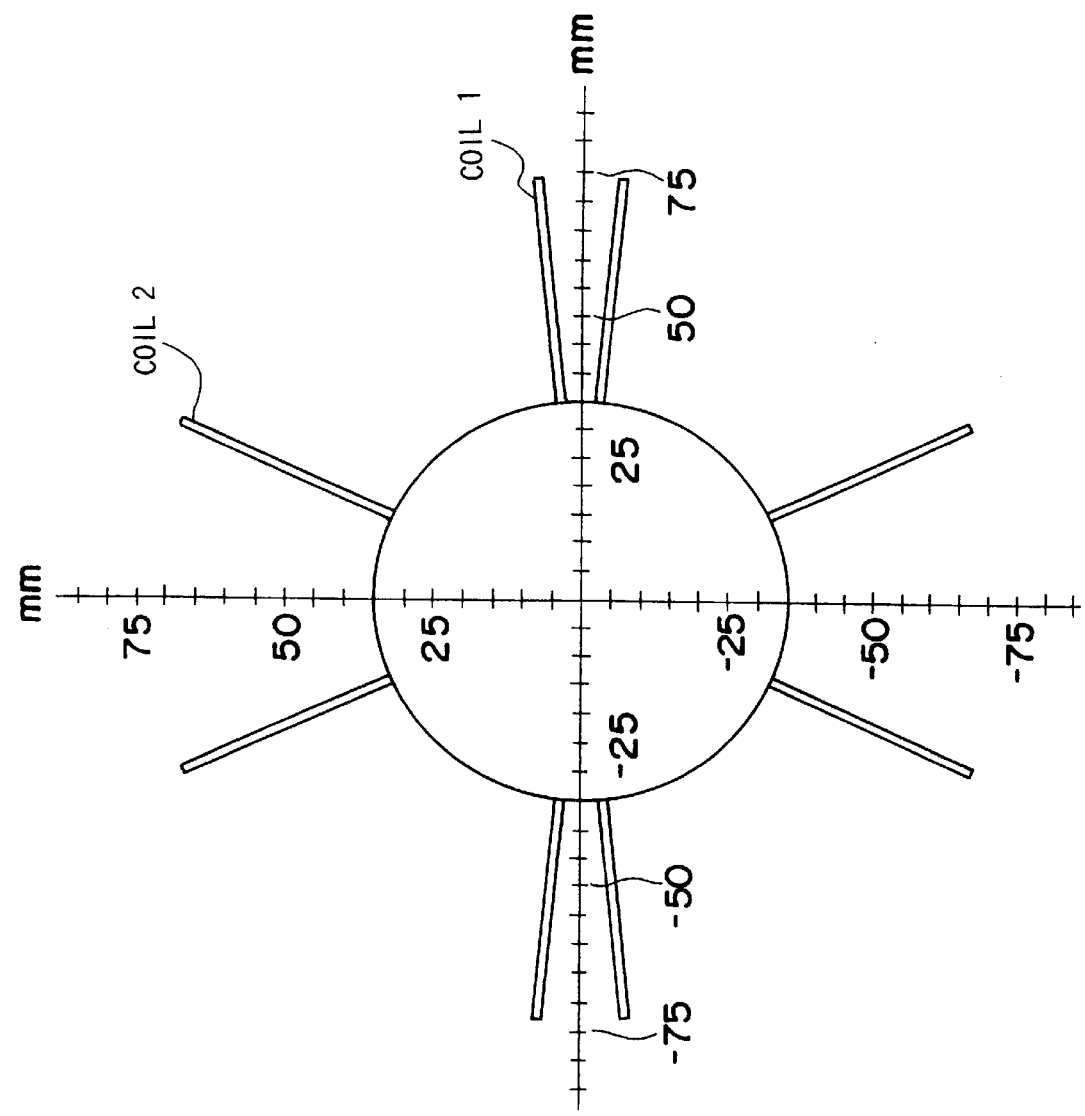
FIG. 6 is a view showing a toroidal-type deflecting coil arrangement employed in a comparative example.

In the examples 1–4 shown in FIG. 15, the deflectors C1 to C8, and P1 to P4 are all the same types of deflector. With regards to the correspondence of the deflectors shown in examples 1 to 4 and the deflectors 1 to 12 shown in FIG. 11 to FIG. 14, deflector No. 1 is applied to the deflector of example 1 deflector No. 11 is applied to the deflector of example 2, deflector No. 2 is applied to the deflector of example 3, and deflector No. 3 is applied to the deflector of example 4. In the comparative example shown, a deflector is used with an angular configuration such that the 3θ and 5θ components of the magnetic field are eliminated but the 7θ component of the magnetic field is not eliminated. Further, FIG. 2 shows a lateral cross-section of the deflector of example 1, FIG. 3 shows a lateral cross-section of the deflector of example 2, FIG. 4 shows a lateral cross-section of the deflector of example 3, FIG. 5 shows a lateral cross-section of the deflector of example 4, and FIG. 6 shows a lateral cross-section of the deflector of the comparative example.

As can be seen from FIG. 15, in the case of the comparative example, because the angular configuration of the deflector is not set in such a manner as to eliminate the 7θ component of the magnetic field, blurring due to the four-fold aberration errors which are not eliminated of 250 nm occurs and distortion of 300 nm occurs. On the other hand, in all of the examples 1 to 4 where a configuration capable of eliminating the 7θ component of the magnetic field is set up, the four-fold aberrations caused for up to the 7θ component of the magnetic field are zero.

In the case of example 1 and example 2, an angular configuration of a semi-angle capable of eliminating the 9θ component of the magnetic field is not set and the four-fold aberrations caused by this therefore occur. The setting of the angle of the semi-angle and the ampere-turn values for the second example is designed in such a manner that the amount of 9θ component of the magnetic field generated is 60% of that generated for example 1. The four-fold aberrations of example 2 are therefore reduced to 60% of that of example 1.

In the case of example 3 and example 4, the angular configuration of the semi-angles and the ampere-turn values are set in such a manner as to eliminate the 9θ component of the magnetic field and the occurrence of all superimposition aberrations including the four-fold aberrations caused by the 9θ or less components of the magnetic field can be prevented.

Figure 7:
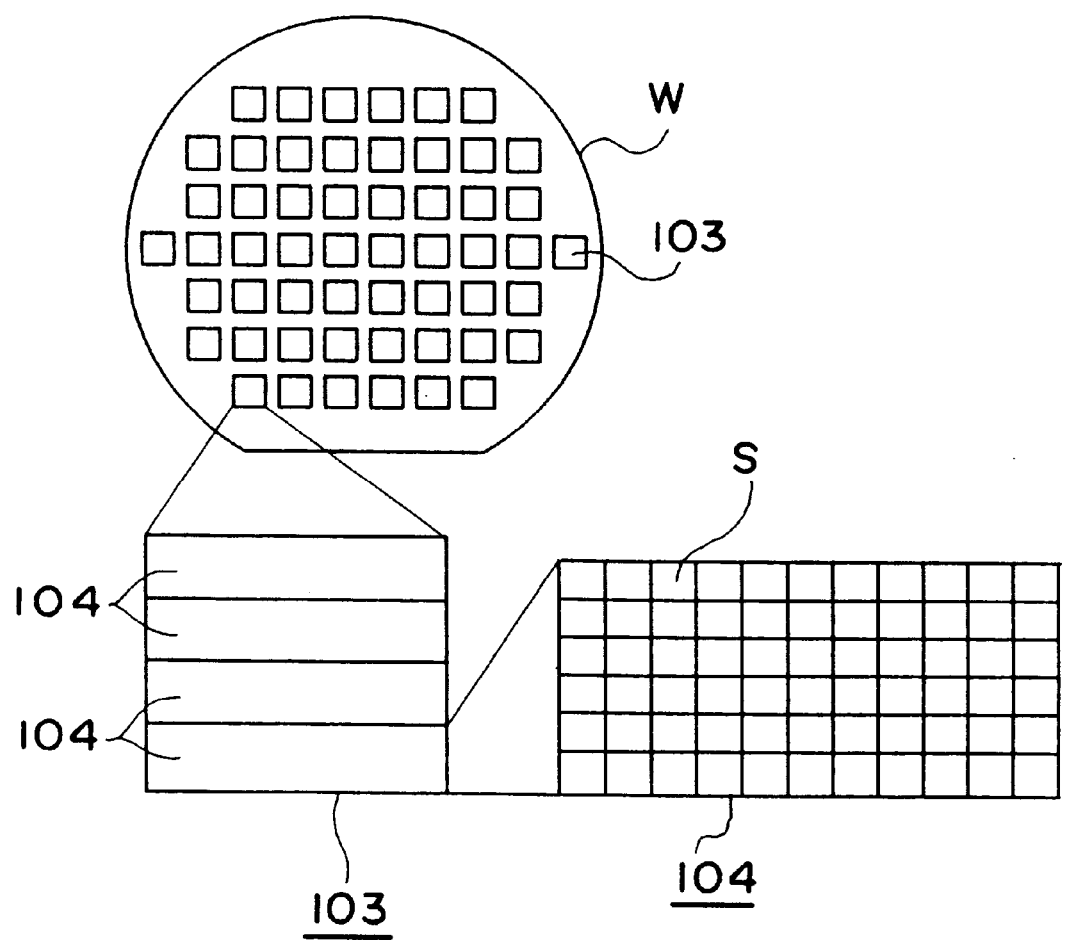
FIG. 7 is a view showing units of divided exposure of a divided projection exposure apparatus.

Next, a description is given of exposure for a divided projection employing this kind of exposure apparatus. FIG. 7 is a view showing divided exposure units. Here, a plurality of chips 103 are formed on a sensitive substrate (normally a wafer) W. A plurality of stripes 104 are then formed on regions of the chip 103, and each strip 104 is then divided into a plurality of mask sub-fields S. A pattern to be transferred to regions of the chip 103 is formed on the reticle 3 (refer to FIG. 1). This pattern is divided into mask stripes 204 (refer to FIG. 8) corresponding to the stripes 104 of the chip 103 and the mask stripes 204 are divided into mask sub-fields S' corresponding to the sub-fields S of the stripes 104.

Figure 8:
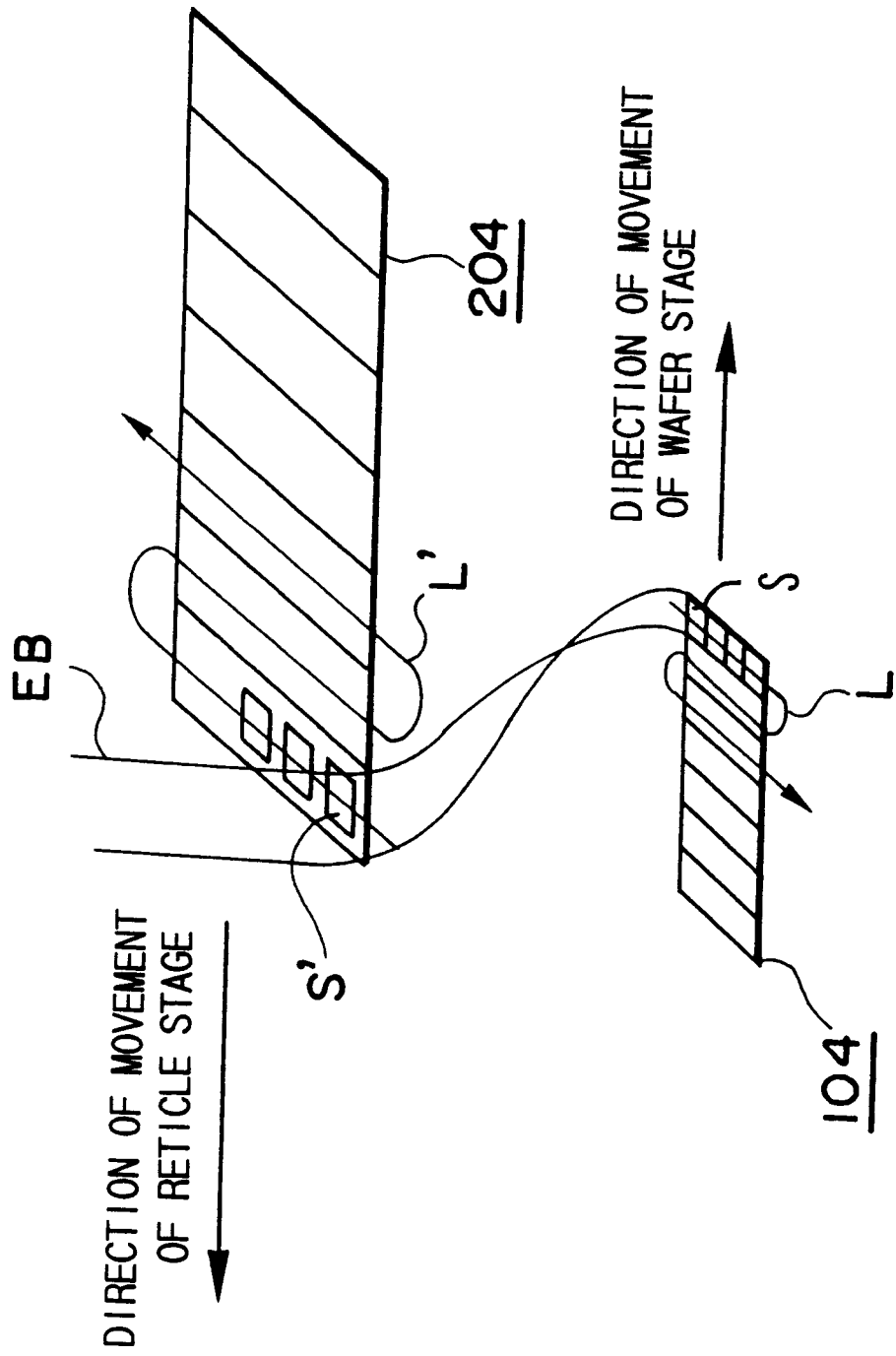
FIG. 8 is a view showing an exposure method for a divided projection exposure apparatus.

Exposure is normally carried out using the method shown in FIG. 8 in this divided projection method. FIG. 8 shows a stripe 104 of the wafer W and a corresponding mask stripe 204 of the reticle 3. First, the reticle stage mounted with the reticle 3 and the wafer stage mounted with the wafer W are moved at each constant speed in accordance with the reduction ratio for pattern projection. The charged particle beam passes through the center of the stripes 104 and mask stripe 204. The mask sub-fields S' on the reticle are irradiated with an electron beam EB and an image of the pattern formed on the mask sub-fields S' is then reduced and projected onto sub-fields S corresponding to the wafer W by the kind of optical projection system shown in FIG. 1.

The electron beam EB is deflected in a direction approximately at right angles to the direction of progression of the reticle stage, and projection and exposure of the mask sub-fields S' and sub-fields S arranged in a line is carried out sequentially. When projection and exposure of one line of mask sub-fields S' and sub-fields S finishes, projection and exposure of the next line of mask sub-fields S' and sub-fields S begins. However, during this time, the direction of deflection of the electron beam EB is reversed as shown in FIG. 8 for each line and throughput can be increased by then sequentially projecting and exposing the mask sub-fields S' and sub-fields S as shown for line L' and L.

The reticle employed by this exposure method is different to the case for exposure apparatus employing light and is divided into the mask sub-fields S' to be formed with the pattern shown in FIG. 8 and a peripheral strut section ST. The peripheral strut section ST is provided to ensure the strength of the reticle itself and to ensure that just the mask sub-fields S' to be exposed are irradiated with the electron beam EB.

Figure 9:
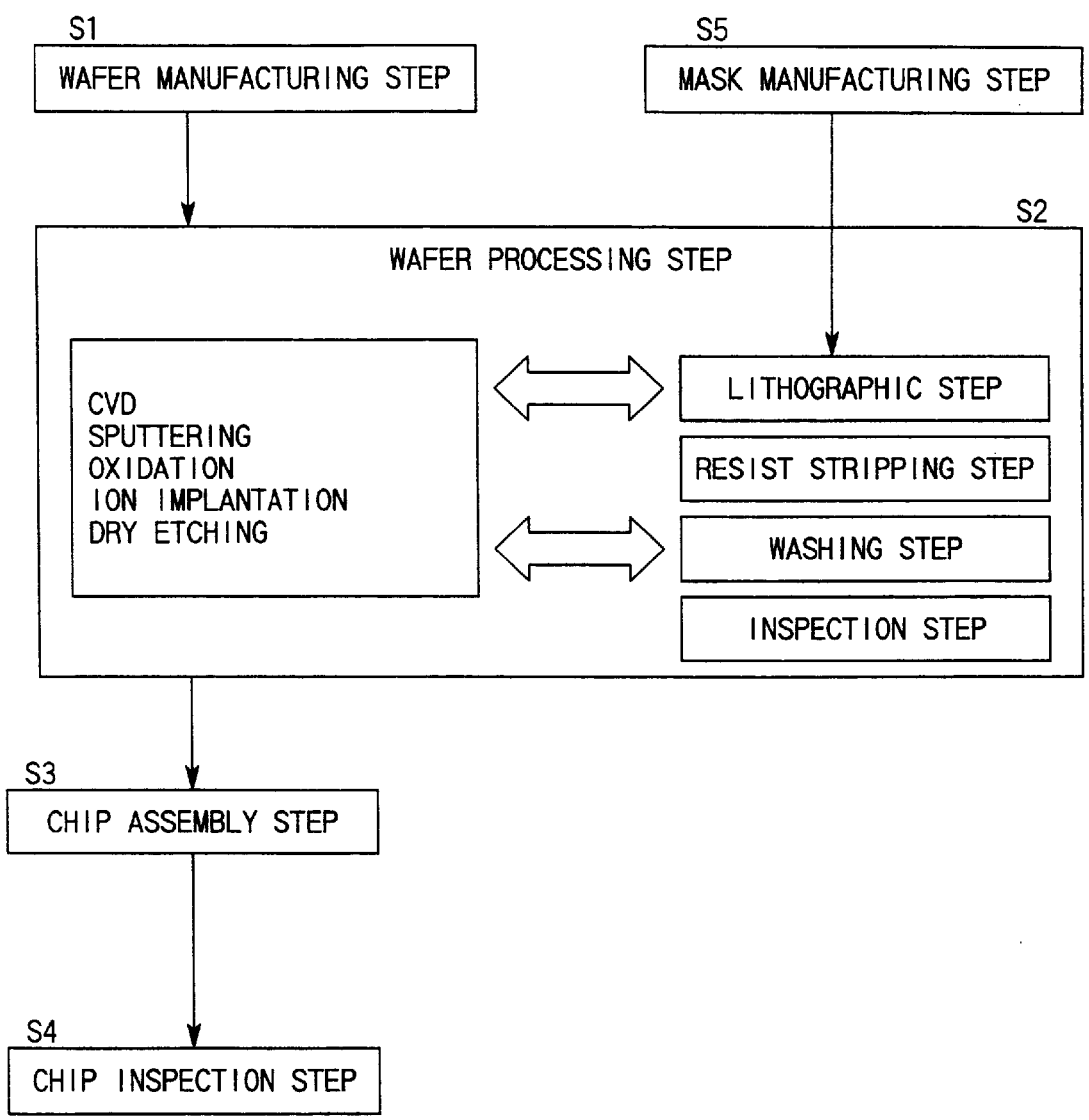
FIG. 9 is a flowchart showing a semiconductor device manufacturing method.

Next, a description is given of a semiconductor device manufacturing method to which the aforementioned exposure apparatus are applied. FIG. 9 is a flowchart showing a semiconductor device manufacturing method principally comprising the steps of a wafer manufacturing step S1 for manufacturing a wafer, a wafer processing step S2 for carrying out processing necessary for forming chips on the wafer, a chip assembly step S3 for cutting out chips formed in the wafer one at a time and carrying out assembly such that operation as a device is possible, a chip inspection step S4 of inspecting the completed chips, and a mask manufacturing step S5 of manufacturing a mask to be used in the wafer processing step S2.

The process of these processes which has the most decisive influence on the performance of the resulting semiconductor devices is the wafer-processing step S2. In this wafer processing step S2, the designed circuit pattern is sequentially formed in a laminated manner on the wafer so that a large number of device chips operating as memory or MPUs are formed on the wafer. The wafer processing step S2 therefore includes: ① a thin-film forming step of forming a metal thin film etc. for forming a dielectric thin-film constituting an insulating film and a metal thin film for forming interconnects and electrodes, using CVD and sputtering, etc., ② an oxidation step of oxidizing the wafer substrate and thin-film layers formed in the thin-film forming step, ③ a lithographic process for forming a resist pattern using a mask (also called as a reticle) in order to selectively process thin-film layers and the wafer substrate, etc., ④ an etching step for processing the thin-film layers and substrate by dry etching etc. using a resist pattern, ⑤ an ion impurity injection step, ⑥ a resist stripping step, ⑦ a washing step of washing the wafer, and ⑧ an inspection step of inspecting the processed wafer, etc. The wafer-processing step S2 is repeated by the required number of layers.

FIG. 10 is a flowchart showing the contents of a lithographic process forming the nucleus of the wafer processing step S2. Resist is applied onto the wafer in a resist application step S11. Then, in an exposure step S12, the resist is exposed by an exposure apparatus using the mask manufactured in the mask-manufacturing step. A resist pattern is then obtained when the exposed resist is developed in a developing step S13. This resist pattern is then stabilized in an annealing step S14.

High-precision exposure is possible in the exposure step S12 by employing the charged particle beam exposure apparatus of the present invention. The step relating to realizing the required minimum line width and corresponding precision of superposition is the lithographic step, and the exposure step S12 including position alignment control in this lithographic step is important. The manufacture of semiconductor devices, the manufacture of which has not been possible up until now, can therefore be made possible be applying the present invention to this exposure step S12.

In the above embodiments, a description is given of an example of an exposure apparatus employing an electron beam, but the present invention can also be applied to exposure apparatus employing charged particle beams including ion beams.

What is claimed is:

1. A charged particle beam exposure apparatus, having deflectors, irradiating a pattern on a mask or reticle with a charged particle beam, and projecting an image of the pattern onto a sensitive substrate, wherein:

semi-angles and ratio of ampere-turn values of deflecting coils of at least one of the deflectors is set in such a manner that a 3θ component, 5θ component and 7θ component of a magnetic field generated by the deflectors become substantially zero.

2. The charged particle beam exposure apparatus of claim 1 wherein:

at least one of the deflectors has n(n≧2) sets of deflecting coils of semi-angles θi of substantially $180° \times i/(2n+1)$ (i=1~n), and ratio of ampere-turn values Ji of the deflecting coils are set to substantially fulfill the following equation with regards to integer values k from 1 to m;

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k=1, 2, \cdots, m) \quad (2)$$

Where a minimum value for m is 3(except that 1 when n=2 and 2 when n=3) and a maximum value for m is (n−1).

3. The charged particle beam exposure apparatus of claim 1 wherein:

at least one of the deflectors has n(n≧3) sets of deflecting coils of semi-angles θi of substantially 180°×(i−½)/(2n−1) (i=1~n), and ratio of ampere-turn values Ji of the deflecting coils are set to substantially fulfill the following equation with regards to integer values k from 1 to m;

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k=1, 2, \cdots, m) \quad (2)$$

Where a minimum value for m is 3(except that 2 when n=3) and a maximum value for m is (n−1).

4. The charged particle beam exposure apparatus of claim 1 wherein:

at least one of the deflectors has at least one of a deflecting coil with a semi-angle of 45° and a deflecting coil having a semi-angle sum of 90° with an another deflecting coil within the deflector.

5. The charged particle beam exposure apparatus of claim 4 wherein:

at least one of the deflectors has n(n≧3) sets of deflecting coils of semi-angles of θi of substantially 180°×i/(2n) (i=1~n), and ratio of ampere-turn values Ji of the deflecting coils are set to substantially fulfill the following equation with regards to integer values k from 1 to m;

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k=1, 2, \cdots, m) \quad (2)$$

Where a minimum value for m is 3(except that 2 when n=3) and a maximum value for m is (n−1).

6. The charged particle beam exposure apparatus of claim 4 wherein:

at least one of the deflectors has n(n≧3) sets of deflecting coils of semi-angles θi of substantially 180°×(i−½)/(2n) (i=1~n), and ratio of ampere-turn values Ji of the deflecting coils are set to substantially fulfill the following equation with regards to integer values k from 1 to m;

$$\sum_{i=1}^{n} J_i \cdot \sin(\theta_i) \neq 0 \quad (1)$$

$$\sum_{i=1}^{n} J_i \cdot \sin(2k+1)\theta_i = 0 \quad (k=1, 2, \cdots, m) \quad (2)$$

Where a minimum value for m is 3(except that 2 when n=3) and a maximum value for m is (n−1).

7. The charged particle exposure apparatus of claim 1 wherein:

at least one of the deflectors has n(n≧3) sets of deflecting coils and ampere-turn values of these deflecting coils are set substantially equal.

8. A semiconductor device manufacturing method having a lithographic step wherein:

in the lithographic step, a charged particle beam exposure apparatus as defined in claim 1.

9. A semiconductor device manufactured by the semiconductor device manufacturing method defined in claim 8.

* * * * *